(12) United States Patent
Kouma et al.

(10) Patent No.: US 8,202,382 B2
(45) Date of Patent: Jun. 19, 2012

(54) METHOD FOR MANUFACTURING MICRO MOVABLE ELEMENT

(75) Inventors: Norinao Kouma, Kawasaki (JP);
Osamu Tsuboi, Kawasaki (JP);
Yoshihiro Mizuno, Kawasaki (JP);
Hiromitsu Soneda, Kawasaki (JP);
Hisao Okuda, Kawasaki (JP); Tsuyoshi Matsumoto, Kawasaki (JP); Ippei Sawaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 354 days.

(21) Appl. No.: 12/509,584

(22) Filed: Jul. 27, 2009

(65) Prior Publication Data

US 2010/0018635 A1    Jan. 28, 2010

(30) Foreign Application Priority Data

Jul. 28, 2008   (JP) .................................. 2008-193189

(51) Int. Cl.
*B32B 37/12* (2006.01)

(52) U.S. Cl. ........................................... 156/155; 216/2

(58) Field of Classification Search ........................ None
See application file for complete search history.

(56) References Cited

U.S. PATENT DOCUMENTS

| 2006/0219006 | A1* | 10/2006 | Nasiri et al. ................ 73/504.12 |
| 2007/0012653 | A1* | 1/2007 | Nasiri et al. ........................ 216/2 |
| 2007/0084042 | A1* | 4/2007 | Challoner et al. ............ 29/592.1 |
| 2007/0119252 | A1* | 5/2007 | Adams et al. .................... 73/510 |
| 2007/0209437 | A1* | 9/2007 | Xue et al. .................... 73/514.31 |
| 2007/0266787 | A1* | 11/2007 | LaFond et al. .............. 73/514.01 |
| 2008/0115579 | A1* | 5/2008 | Seeger et al. ............... 73/504.12 |

FOREIGN PATENT DOCUMENTS

| JP | 2003-19700 A | 1/2003 |
| JP | 2004-66379 A | 3/2004 |
| JP | 2004-341364 A | 12/2004 |
| JP | 2006-72252 A | 3/2006 |

\* cited by examiner

*Primary Examiner* — Allan Olsen
(74) *Attorney, Agent, or Firm* — Fujitsu Patent Center

(57) ABSTRACT

A method for manufacturing a micro movable element includes: forming a movable section, a frame, and a connecting section connecting the movable section with the frame on a substrate; bonding a film to a surface of the substrate in forming the movable section, the frame, and the connecting section; and patterning the film to form a support structure being bridged between the movable section and the frame.

2 Claims, 15 Drawing Sheets

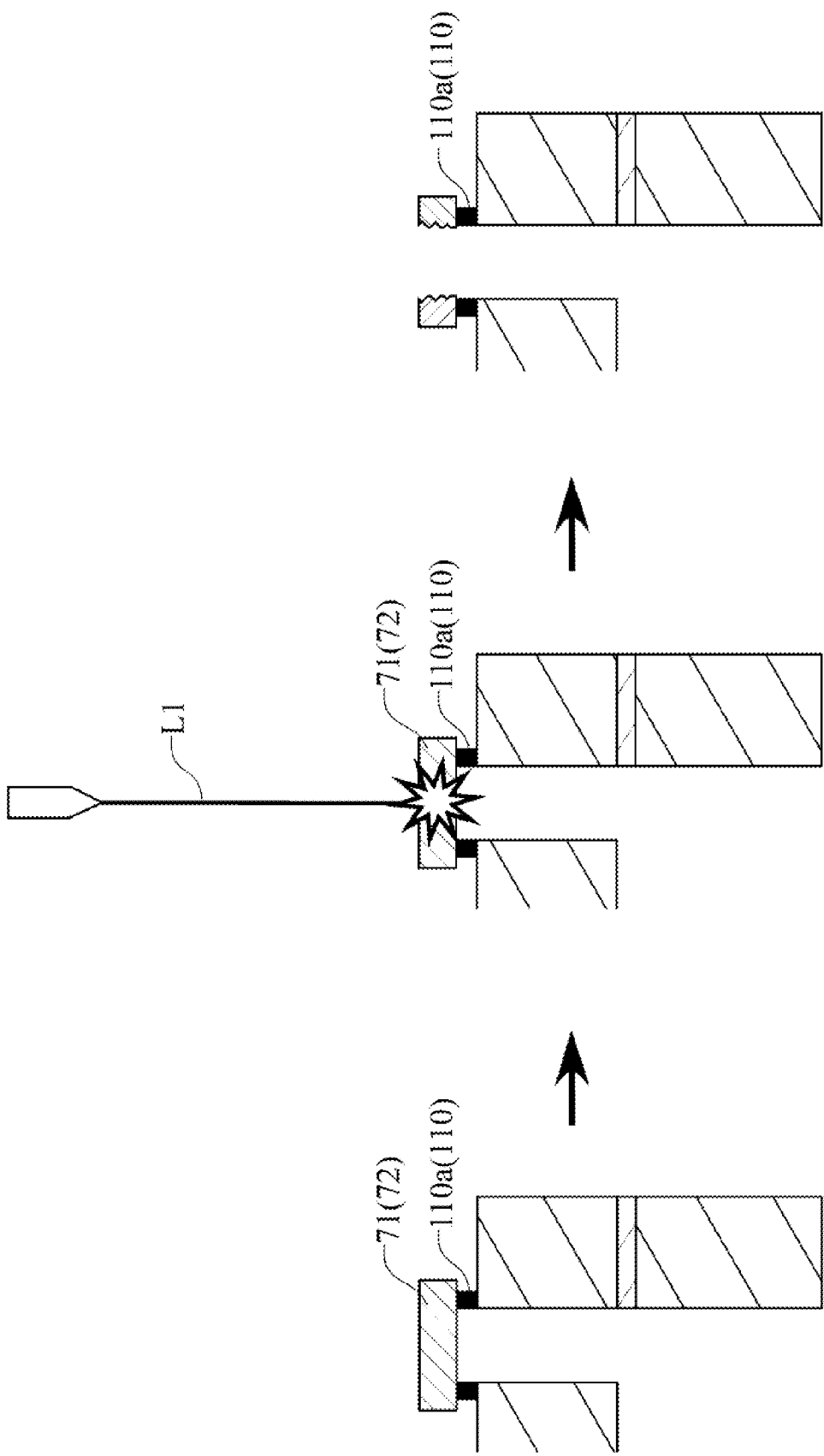

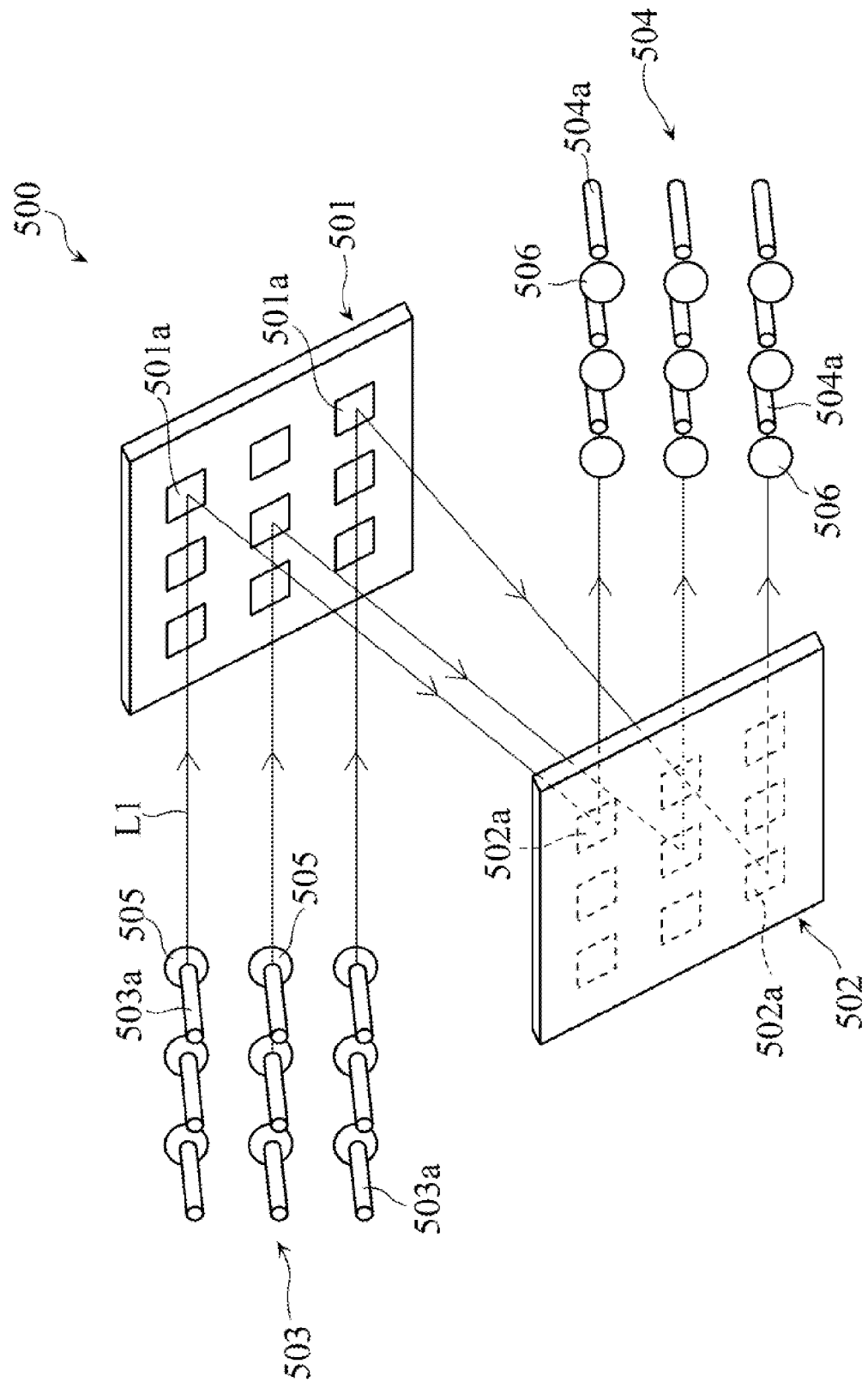

METHOD FOR MANUFACTURING MICRO MOVABLE ELEMENT

CROSS-REFERENCE TO RELATED APPLICATION

This application is based upon and claims the benefit of priority of the prior Japanese Patent Application No. 2008-193189, filed on Jul. 28, 2008, the entire contents of which are incorporated herein by reference.

FIELD

The embodiments and examples thereof as discussed herein are related to a method for manufacturing a micro movable element including a minute movable section.

BACKGROUND

In recent years, elements having a minute structure formed by micromachining technology have been put to practical use in various technical fields. Examples of such elements include a micro movable element having a minute oscillating section or a vibrating section, such as a micromirror element, an angular velocity sensor, and an acceleration sensor. A micromirror element is utilized as an element bearing a light reflection function in the technical fields of optical disks or optical telecommunications, for example. An angular velocity sensor and an acceleration sensor are utilized in a video camera or a camera phone as an image stabilizing function, in a car navigation system, an airbag inflation timing system, or a posture controlling system of a car or a robot, for example. JP-A-2003-19700, JP-A-2004-341364, and JP-A-2006-72252 disclosed such micro movable elements.

SUMMARY

According to an aspect of an embodiment, a method for manufacturing a micro movable element that includes: forming a movable section, a frame, and a connecting section connecting the movable section with the frame on a substrate; bonding a film to a surface of the substrate in forming the movable section, the frame, and the connecting section; and patterning the film to form a support structure being bridged between the movable section and the frame.

BRIEF DESCRIPTION OF DRAWINGS

FIG. 15 illustrates a support beam cutting process according to an example of an embodiment;

FIG. 16 is a schematic view of an optical switching device in another example of an embodiment.

DESCRIPTION OF EMBODIMENTS

Figure 1:
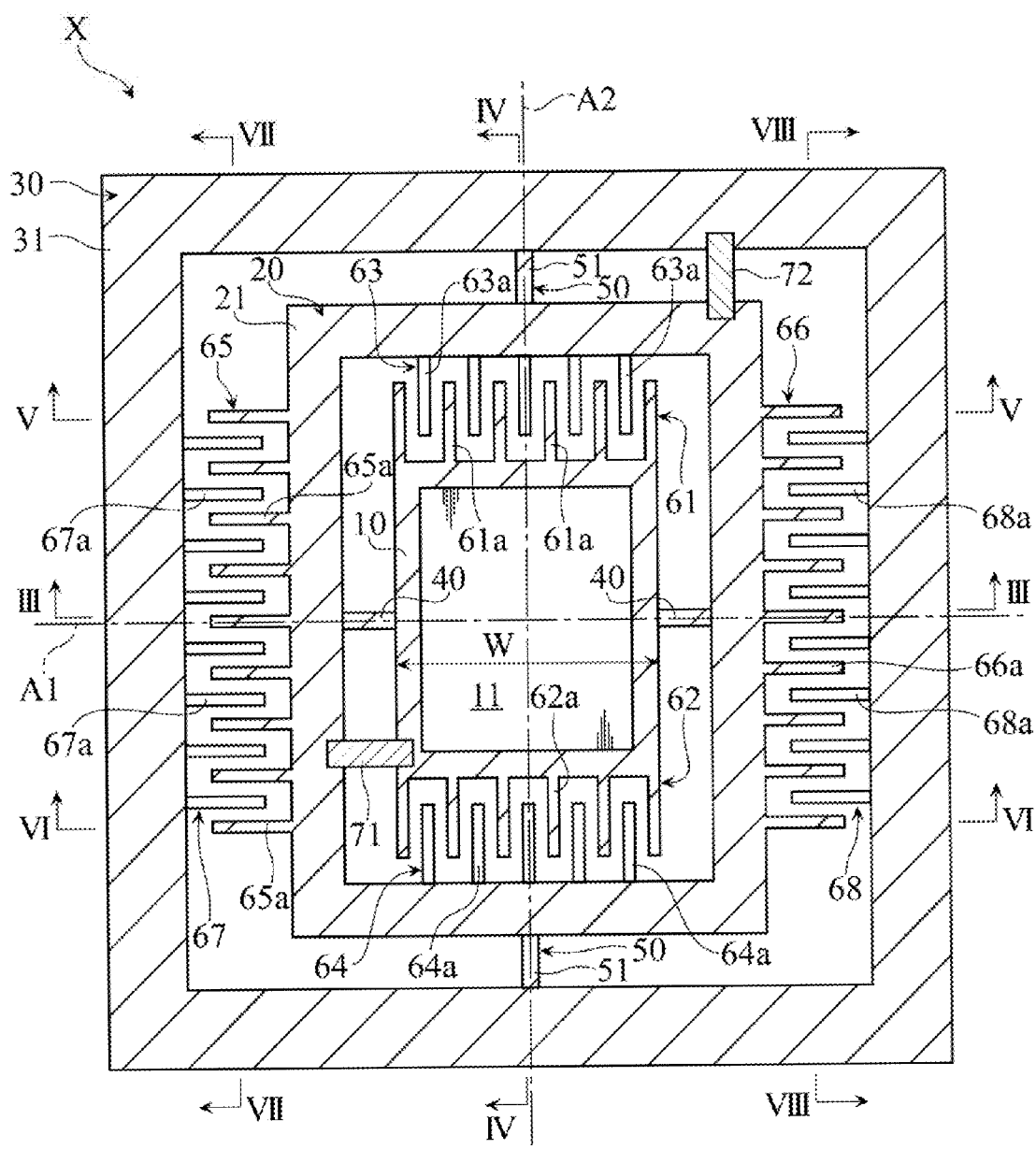
FIG. 1 is a plan view of a micro movable element in an example of an embodiment.
Figure 2:
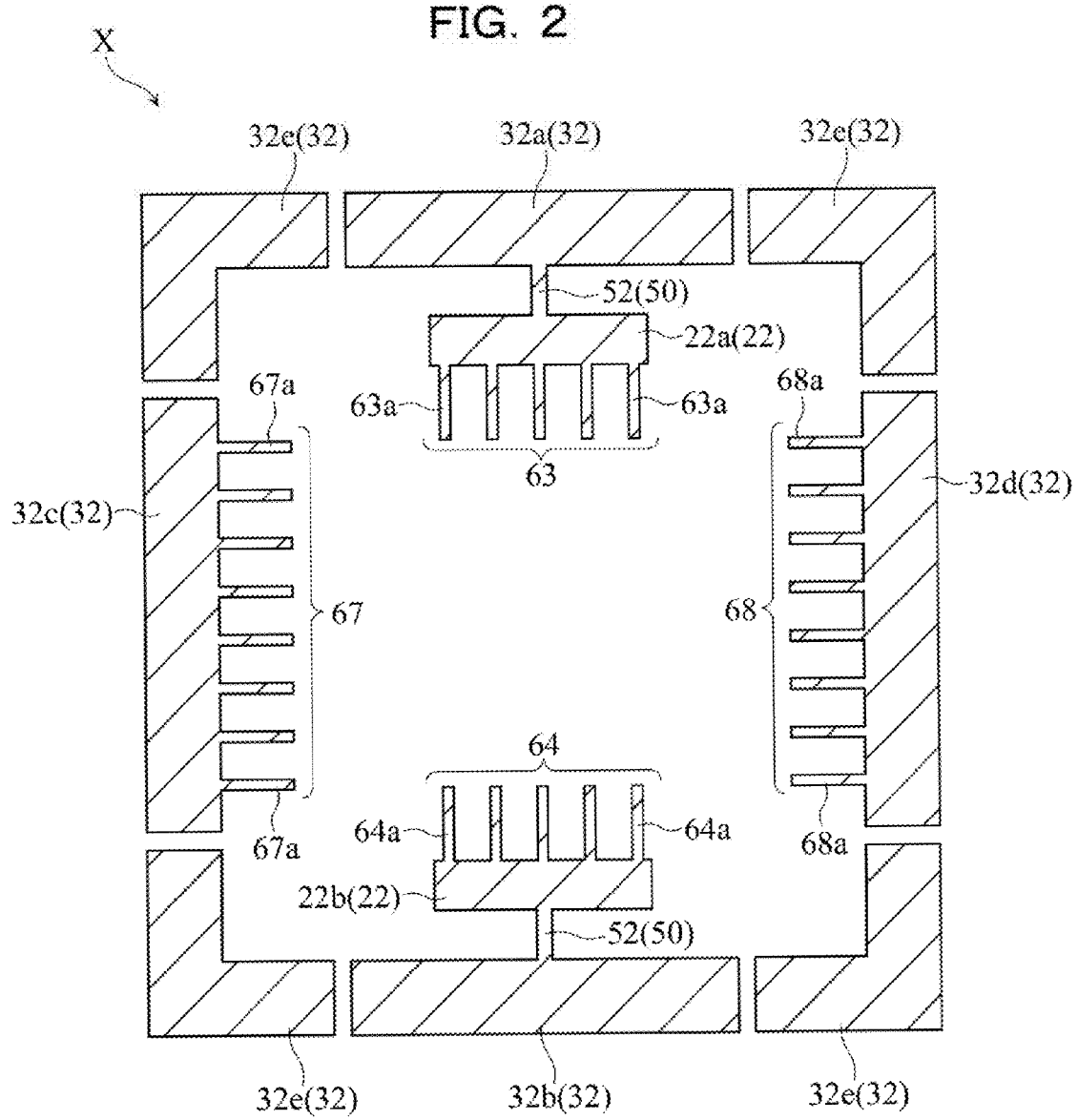
FIG. 2 is a plan view partially illustrating the micro movable element illustrated in FIG. 1.

FIGS. 1 to 8 illustrate a micro movable element X according to one example. FIG. 1 is a plan view of the micro movable element X. FIG. 2 is a plan view partially illustrating the micro movable element X. FIGS. 3 to 8 are cross sectional views respectively taken along lines III-III, IV-IV, V-V, VI-VI, VII-VII, and VIII-VIII of FIG. 1.

The micro movable element X includes an oscillation section 10, a frame 20, a frame 30, a pair of torsion bars 40, a pair of torsion bars 50, comb electrodes 61, 62, 63, 64, 65, 66, 67, and 68, and support beams 71 and 72. In the embodiment, the micro movable element X is applied to a micromirror element with support beams. The micro movable element X is manufactured by processing a material substrate by bulk micromachining technology such as MEMS technology. As a material substrate, the so-called silicon on insulator (SOI) wafer is used. The material substrate has a laminated structure including a first silicon layer, a second silicon layer, and an insulating layer between the first and second silicon layers. Conductivity is imparted to the first and second silicon layers by doping an impurity. Each of the parts in the micro movable element X is derived and formed mainly from the first silicon layer or the second silicon layer. Accordingly, in view of the clarification of the drawing, parts which are derived from the first silicon layer and project closer to the viewer of the drawing than the insulating layer are marked with diagonal lines in FIG. 1. The structure illustrated in FIG. 2 is derived from the second silicon layer in the micro movable element X.

The oscillation section 10 is a part derived from the first silicon layer. A mirror surface 11 having a light reflecting function is disposed on the surface of the oscillation section 10. In the oscillation section 10, a length W illustrated in FIG. 1 is from 20 to 300 μm, for example.

Figure 4:
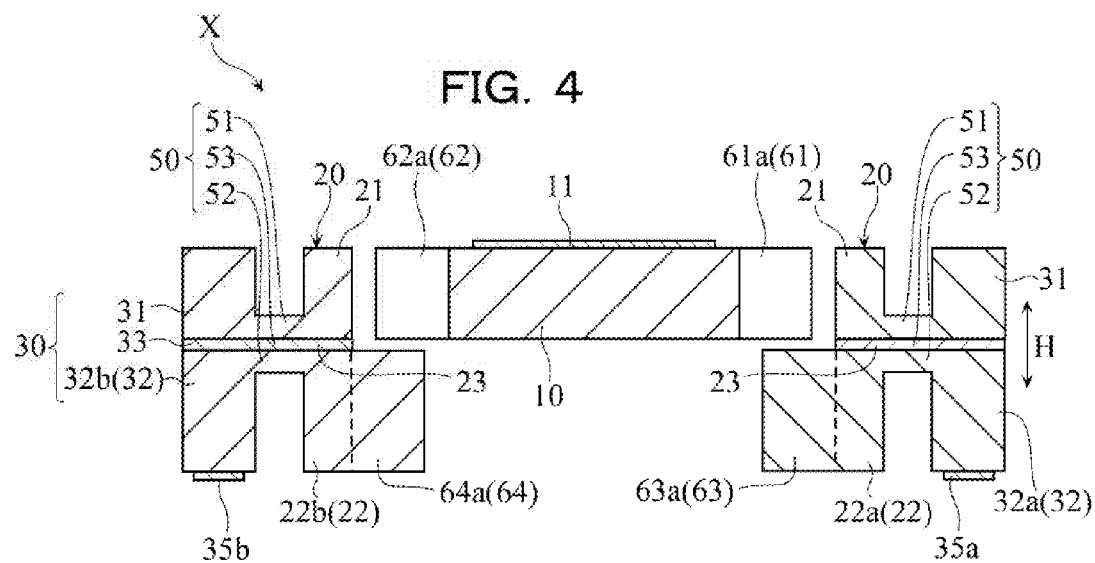
FIG. 4 is a cross sectional view taken along line IV-IV of FIG. 1.

The frame 20 is an inner frame having a shape surrounding the oscillation section 10. As illustrated in FIG. 4, for example, the frame 20 has a laminated structure including a first layer section 21 derived from the first silicon layer, a second layer section 22 derived from the second silicon layer, and an insulating layer 23 between the first and second layer sections 21 and 22. As illustrated in FIGS. 2 and 4, the second layer section 22 includes sections 22a and 22b. The first layer section 21 and the second layer section 22 are electrically separated from each other by the insulating layer 23.

Figure 3:
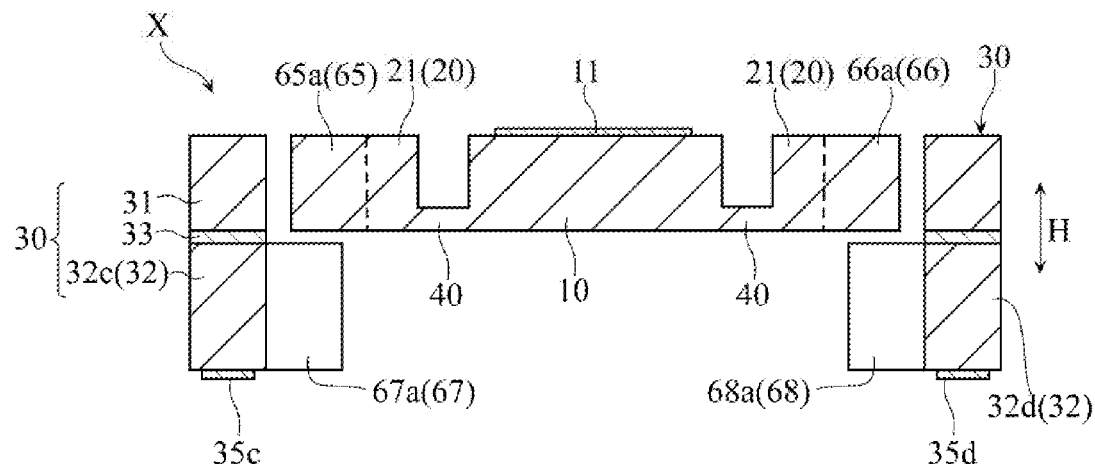
FIG. 3 is a cross sectional view taken along line III-III of FIG. 1.
Figure 7:
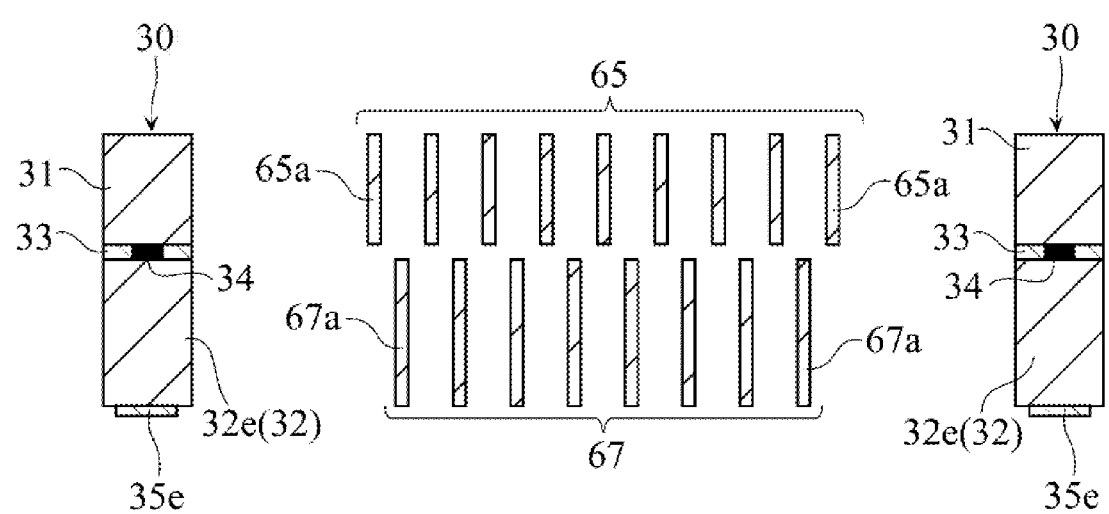
FIG. 7 is a cross sectional view taken along line VII-VII of FIG. 1.
Figure 8:
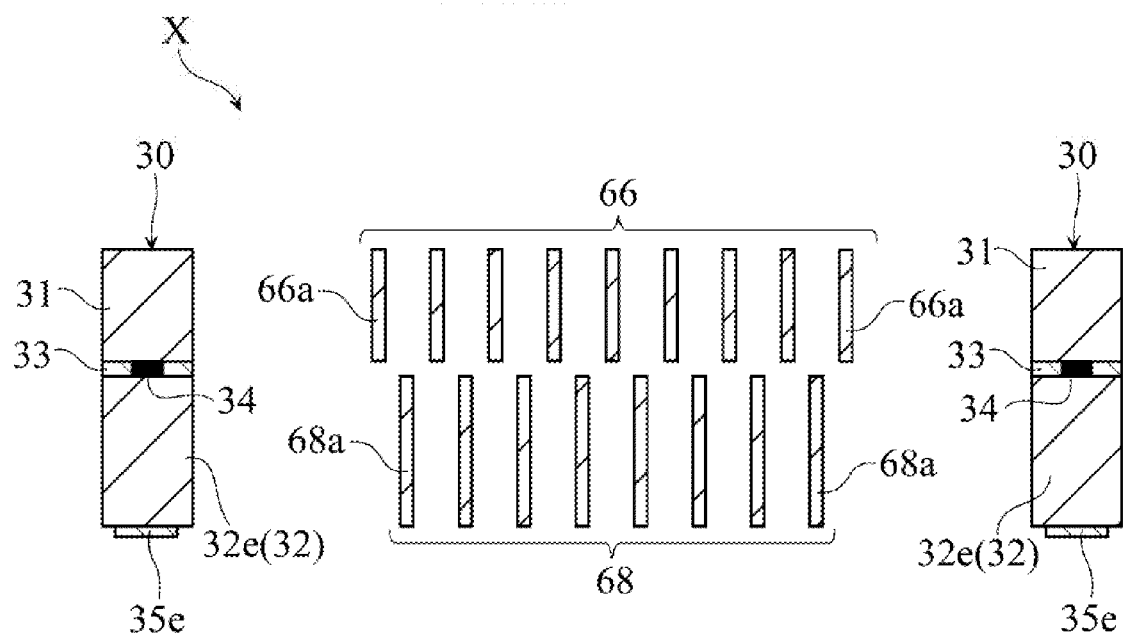
FIG. 8 is a cross sectional view taken along line VIII-VIII of FIG. 1.

The frame 30 is an outer frame having a shape surrounding the frame 20. As illustrated in FIGS. 3 and 4, for example, the frame 30 has a laminated structure including a first layer section 31 derived from the first silicon layer, a second layer section 32 derived from the second silicon layer, and an insulating layer 33 between the first and second layer sections 31 and 32. As illustrated in FIG. 2, the second layer section 32 includes sections 32a, 32b, 32c, 32d, and 32e which are apart from one another via gaps. The first layer section 31 and the sections 32a, 32b, 32c, and 32d of the second layer section 32 are electrically separated from each other by the insulating layer 33. As illustrated in FIGS. 7 and 8, the first layer section 31 and each of the sections 32e of the second layer section 32 are electrically connected to each other via a conductive via 34 penetrating through the insulating layer 33. As illustrated in FIG. 4, an electrode pad 35a is disposed on the surface of the section 32a in the second layer section 32. An electrode pad 35b is disposed on the surface of the section 32b. As illustrated in FIG. 3, an electrode pad 35c is disposed on the surface of the section 32c. An electrode pad 35d is disposed on the surface of the section 32d. As illustrated in FIG. 8, an electrode pad 35e is disposed on the surface of each of the sections 32e.

Each of the pair of torsion bars 40 is a part derived from the first silicon layer. The pair of torsion bars 40 are connected to the oscillation section 10 and the first layer section 21 of the frame 20. Thus, the oscillation section 10 and the frame 20 are connected to each other. The oscillation section 10 and the first layer section 21 are electrically connected to each other by the torsion bars 40. As illustrated in FIG. 3, the torsion bars 40 are thinner than the oscillation section 10 and thinner than the first layer section 21 of the frame 20 in a thickness direction H of the element. The pair of torsion bars 40 define an axial center A1 of the oscillating operation of the oscillation section 10.

As illustrated in FIG. 4, each of the pair of torsion bars 50 has a laminated structure including a first layer section 51 derived from the first silicon layer, a second layer section 52 derived from the second silicon layer, and an insulating layer 53 between the first and second layer sections 51 and 52. The pair of torsion bars 50 connects the frame 20 with the frame 30. In one of the torsion bars 50, the first layer section 51 is connected to the first layer section 21 of the frame 20 and the first layer section 31 of the frame 30. Thus, the first layer sections 21 and 31 are electrically connected to each other. The second layer section 52 is connected to the section 22a of the second layer section 22 of the frame 20 and the section 32a of the second layer section 32 of the frame 30. Thus, the sections 22a and 32a are electrically connected to each other. In the other torsion bar 50, the first layer section 51 is connected to the first layer section 21 of the frame 20 and the first layer section 31 of the frame 30. Thus, the first layer sections 21 and 31 are electrically connected to each other. The second layer section 52 is connected to the section 22b of the second layer section 22 of the frame 20 and the section 32b of the second layer section 32 of the frame 30. Thus, the sections 22b and 32b are electrically connected to each other. Each of the first layer sections 51 of the torsion bars 50 is thinner than the first layer section 21 of the frame 20 and thinner than the first layer section 31 of the frame 30 in the element thickness direction H. At substantially the same time, each of the second layer sections 52 of the torsion bars 50 is thinner than the second layer section 22 of the frame 20 and thinner than the second layer section 32 of the frame 30 in the element thickness direction H. The pair of torsion bars 50 define an axial center A2 of the oscillating operation of the frame 20 and the oscillation section 10. Also, the axial center A2 is perpendicular to the axial center A1.

Figure 5:
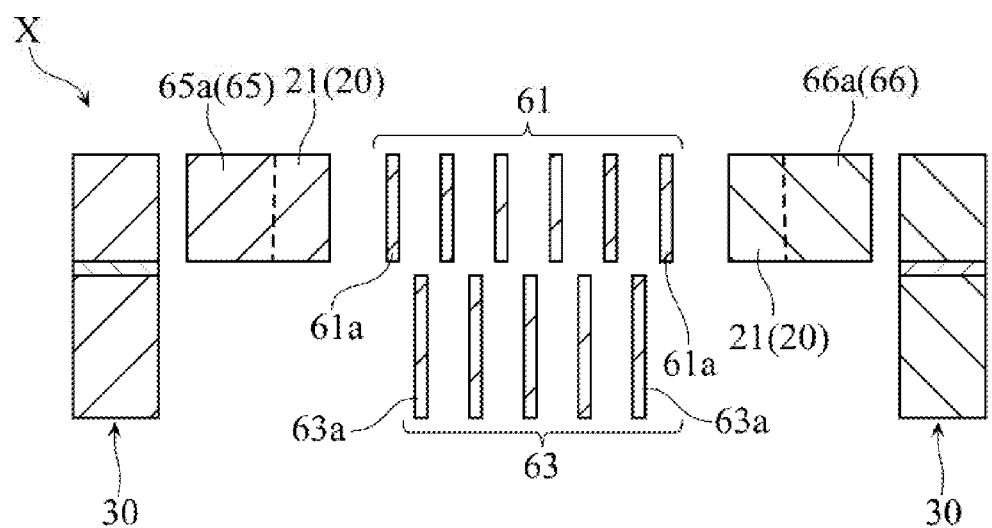
FIG. 5 is a cross sectional view taken along line V-V of FIG. 1.

The comb electrode 61 is a part derived from the first silicon layer. As illustrated in FIGS. 1 and 5, the comb electrode 61 includes a plurality of electrode teeth 61a. The plurality of electrode teeth 61a extend from the oscillation section 10 in a direction perpendicular to the axial center A1 and in parallel with one another.

Figure 6:
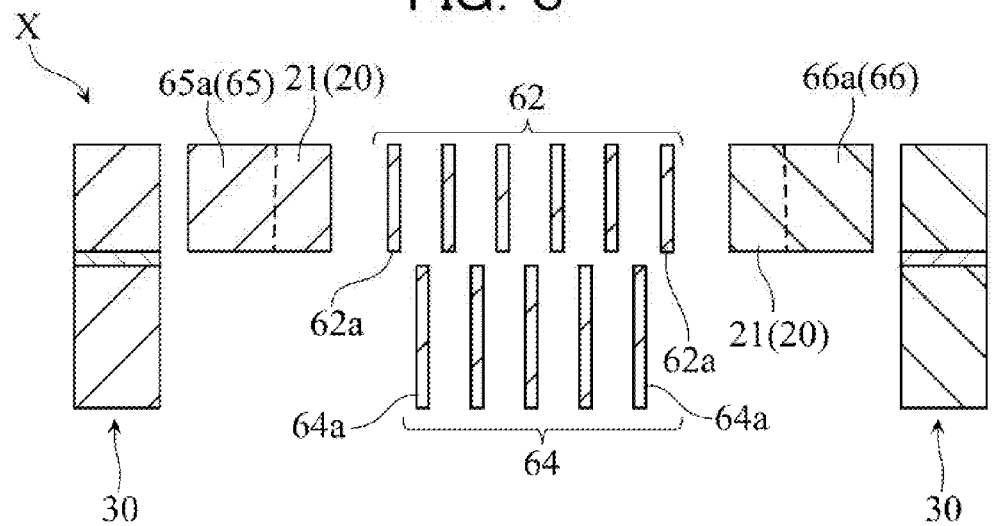
FIG. 6 is a cross sectional view taken along line VI-VI of FIG. 1.

The comb electrode 62 is a part derived from the first silicon layer. As illustrated in FIGS. 1 and 6, the comb electrode 62 includes a plurality of electrode teeth 62a. The plurality of electrode teeth 62a extend from the oscillation section 10 to the side opposite to the electrode teeth 61a in a direction perpendicular to the axial center A1 and in parallel with one another.

The comb electrode 63 is a part derived from the second silicon layer. As illustrated in FIGS. 1, 2, and 5, the comb electrode 63 includes a plurality of electrode teeth 63a. The plurality of electrode teeth 63a extend from the section 22a of the second layer section 22 of the frame 20 to the side of the oscillation section 10 or the comb electrode 61 in a direction perpendicular to the axial center A1 and in parallel with one another. The comb electrode 63 serves as an actuator of the element in cooperation with the comb electrode 61.

The comb electrode 64 is a part derived from the second silicon layer. As illustrated in FIGS. 1, 2, and 6, the comb electrode 64 includes a plurality of electrode teeth 64a. The plurality of electrode teeth 64a extend from the section 22b of the second layer section 22 of the frame 20 to the side of the oscillation section 10 or the comb electrode 62 in a direction perpendicular to the axial center A1 and in parallel with one another. The comb electrode 64 serves as an actuator of the element in cooperation with the comb electrode 62.

The comb electrode 65 is a part derived from the first silicon layer. As illustrated in FIGS. 1 and 7, the comb electrode 65 includes a plurality of electrode teeth 65a. The plurality of electrode teeth 65a extend from the first layer section 21 of the frame 20 to the side opposite to the oscillation section 10 in a direction perpendicular to the axial center A2 and in parallel with one another.

The comb electrode 66 is a part derived from the first silicon layer. As illustrated in FIGS. 1 and 8, the comb electrode 66 includes a plurality of electrode teeth 66a. The plurality of electrode teeth 66a extend from the first layer section 21 of the frame 20 to the side opposite to the oscillation section 10 in a direction perpendicular to the axial center A2 and in parallel with one another.

The comb electrode 67 is a part derived from the second silicon layer. As illustrated in FIGS. 1, 2, and 7, the comb electrode 67 includes a plurality of electrode teeth 67a. The plurality of electrode teeth 67a extend from the section 32c of the second layer section 32 of the frame 30 to the side of the frame 20 or the comb electrode 65 in a direction perpendicular to the axial center A2 and in parallel with one another. The comb electrode 67 serves as an actuator of the element in cooperation with the comb electrode 65.

The comb electrode 68 is a part derived from the second silicon layer. As illustrated in FIGS. 1, 2, and 8, the comb electrode 68 includes a plurality of electrode teeth 68a. The plurality of electrode teeth 68a extend from the section 32d of the second layer section 32 of the frame 30 to the side of the frame 20 or the comb electrode 66 in a direction perpendicular to the axial center A2 and in parallel with one another. The comb electrode 68 serves as an actuator of the element in cooperation with the comb electrode 66.

The support beam 71 temporarily fixes the oscillation section 10 to the frame 20 in order to prevent or at least reduce damage to the torsion bars 40. As illustrated in FIG. 1, the support beam 71 is bridged between the oscillation section 10 and the frame 20 on the surface on the first silicon layer side. The support beam 71 reinforces the connection between the oscillation section 10 and the frame 20 due to the pair of torsion bars 40 until the support beam 71 is cut. The support beam 71 is cut or removed before the use of the micro movable element X. The support beam 71 is preferably made of an insulating material.

The support beam 72 temporarily fixes the frame 20 to the frame 30 in order to prevent or at least reduce damage to the torsion bars 50. As illustrated in FIG. 1, the support beam 72 is bridged between the frame 20 and the frame 30 on the surface on the first silicon layer side. The support beam 72 reinforces the connection between the frames 20 and 30 due to the pair of torsion bars 50 until the support beam 72 is cut. The support beam 72 is cut or removed before the use of the micro movable element X. The support beam 72 is preferably made of an insulating material.

Figure 12A:
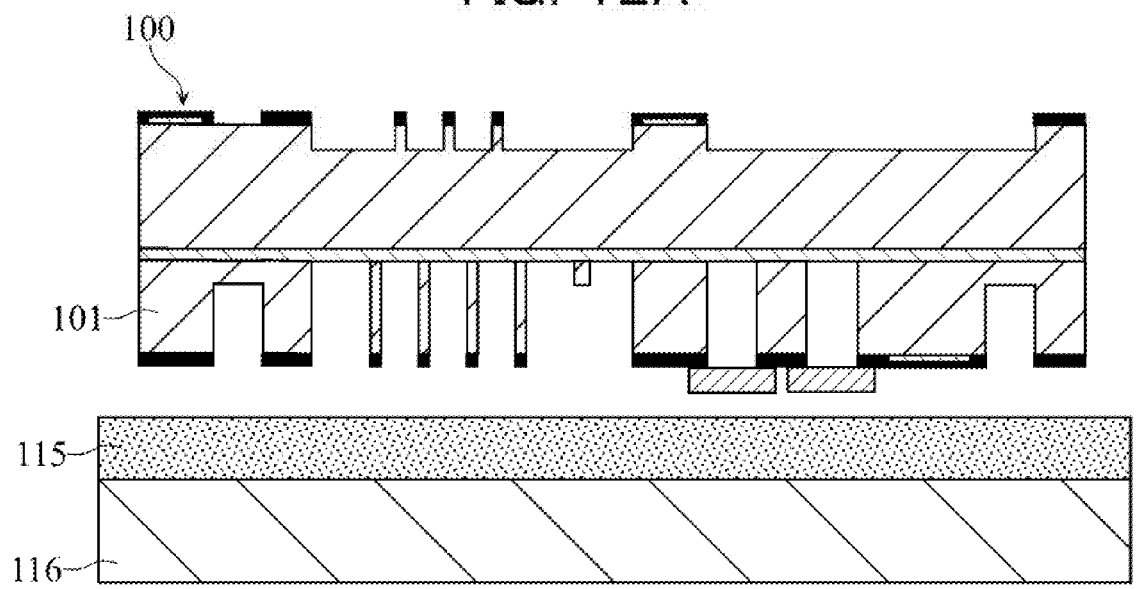
FIGS. 12A and 12B illustrate manufacturing process of the micro movable element subsequent to the manufacturing process illustrated in FIG. 11C.
Figure 12B:
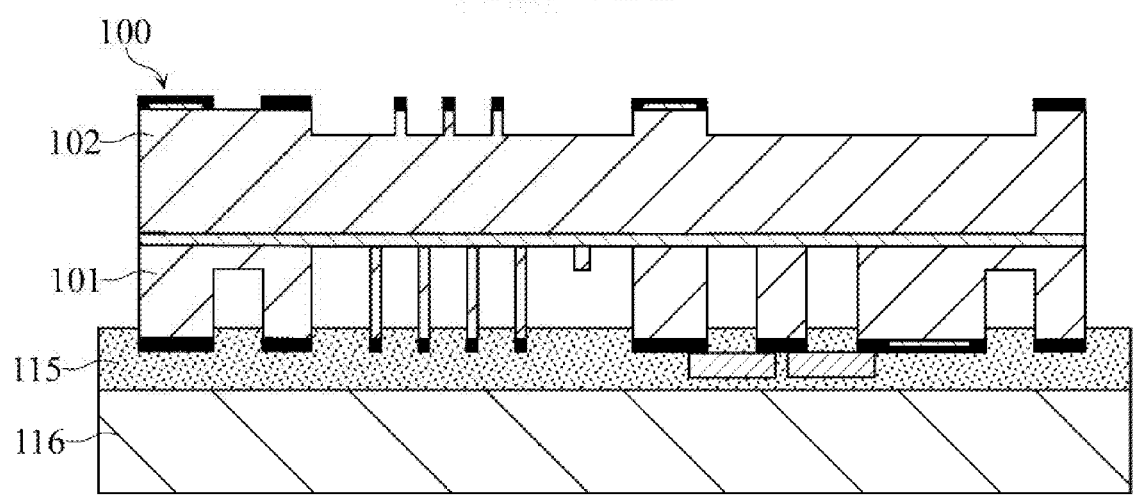
Figure 13A:
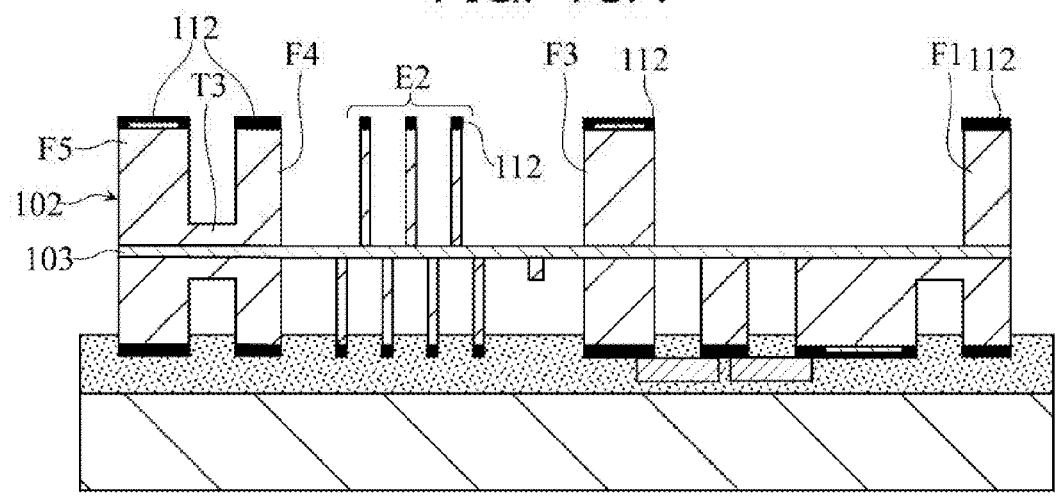
FIGS. 13A to 13C illustrate manufacturing process of the micro movable element subsequent to the manufacturing process illustrated in FIG. 12B.
Figure 13B:
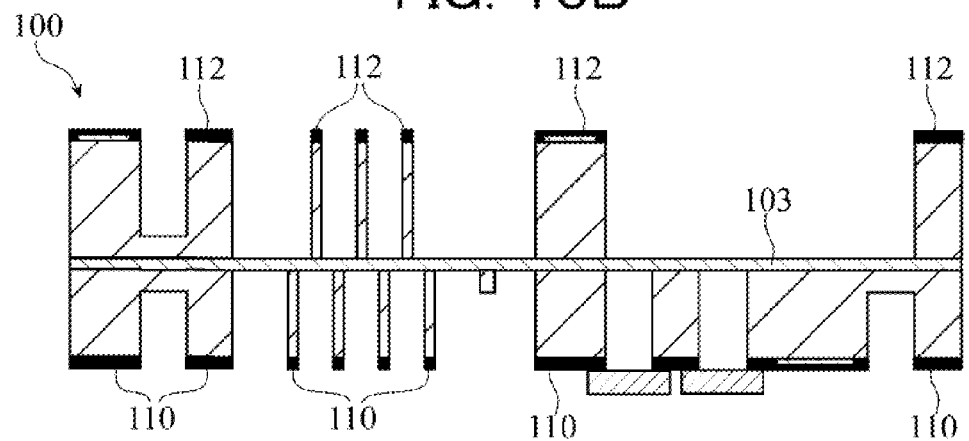
Figure 13C:
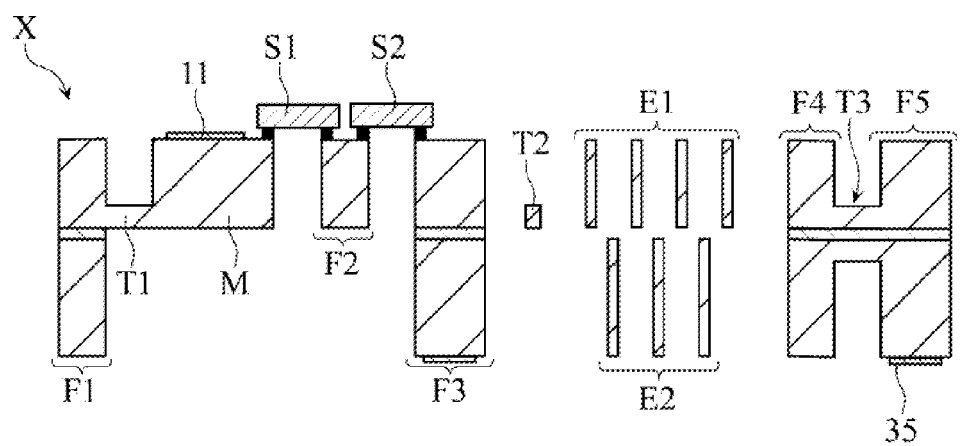

FIGS. 9A to 13C illustrate manufacturing process of the micro movable element X. The method is one technique for manufacturing the micro movable element X by micromachining technology. In FIGS. 9A to 13C, the forming process of an oscillation section M, frames F1, F2, F3, F4, and F5, torsion bars T1, T2, and T3, a set of comb electrodes E1 and E2, and support beams S1 and S2, illustrated in FIG. 13C, is illustrated as change in one cross section. The oscillation section M corresponds to a part of the oscillation section 10. The frames F1, F2, and F4 correspond to the frame 20. The frames F3 and F5 correspond to the frame 30. The torsion bar T1 corresponds to the torsion bar 40. The torsion bar T2 corresponds to the torsion bar 40. The torsion bar T3 corresponds to the torsion bar 50. The comb electrode E1 corresponds to the comb electrodes 61, 62, 65, and 66. The comb electrode E2 corresponds to the comb electrodes 63, 64, 67, and 68. The support beam S1 corresponds to the support beam 71. The support beam S2 corresponds to the support beam 72.

Figure 9A:
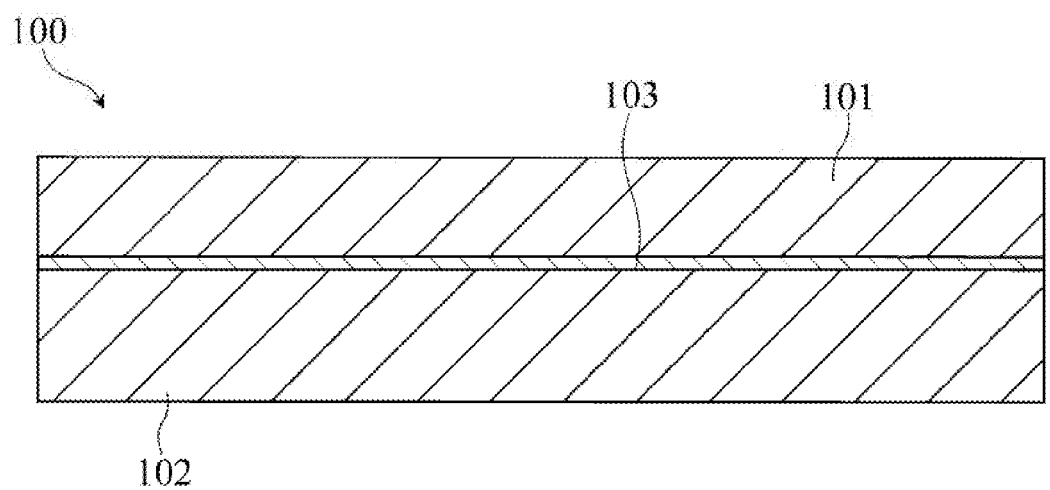
FIGS. 9A to 9C illustrate manufacturing process of the micro movable element illustrated in FIG. 1.

In the manufacture of the micro movable element X, first, a material substrate 100 illustrated in FIG. 9A is prepared. The material substrate 100 has a laminated structure including a silicon layer 101, a silicon layer 102, and an insulating layer 103 between the silicon layers 101 and 102. As the material substrate 100, for example, a silicon on insulator (SOI) wafer is used. A conductive via which is to serve as the conductive via 34 later is previously buried and formed in the material substrate 100 at predetermined places. Conductivity is imparted to the silicon layers 101 and 102 by doping an impurity. As an impurity, a p-type impurity such as B or an n-type impurity such as P or Sb is employed. For example, silicon oxide is used for the insulating layer 103. The thickness of the silicon layer 101 is from 10 to 100 μm, for example. The thickness of the silicon layer 102 is from 100 to 500 μm, for example. The thickness of the insulating layer 103 is from 0.2 to 2 μm, for example.

Figure 9B:
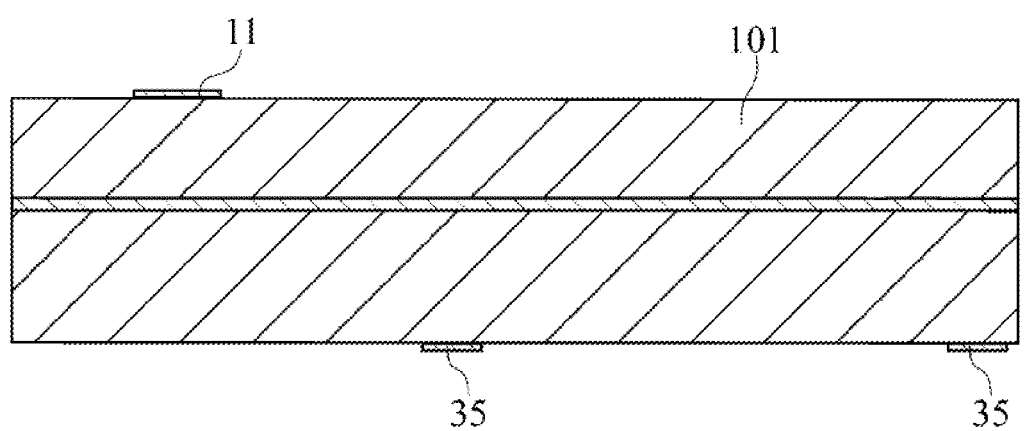

As illustrated in FIG. 9B, next, a mirror surface 11 is formed on the silicon layer 101. Electrode pads 35 are formed on the silicon layer 102. The electrode pads 35 correspond to the electrode pads 35a, 35b, 35c, 35d, and 35e. In the formation of the mirror surface 11, first, a metal film such as of Cr (50 nm) and a metal film such as of Au (200 nm) are deposited in sequence on the silicon layer 101 by sputtering. Next, an etching process is sequentially performed on these metal films via a mask. Thus, the mirror surface 11 is formed on the silicon layer 101. As an etching solution for Au, for example, potassium iodide-iodine aqueous solution is used. As an etching solution for Cr, for example, di-ammonium cerium nitrate aqueous solution is used. The electrode pads 35 are formed in substantially the same manner as the mirror surface 11, for example.

Figure 9C:
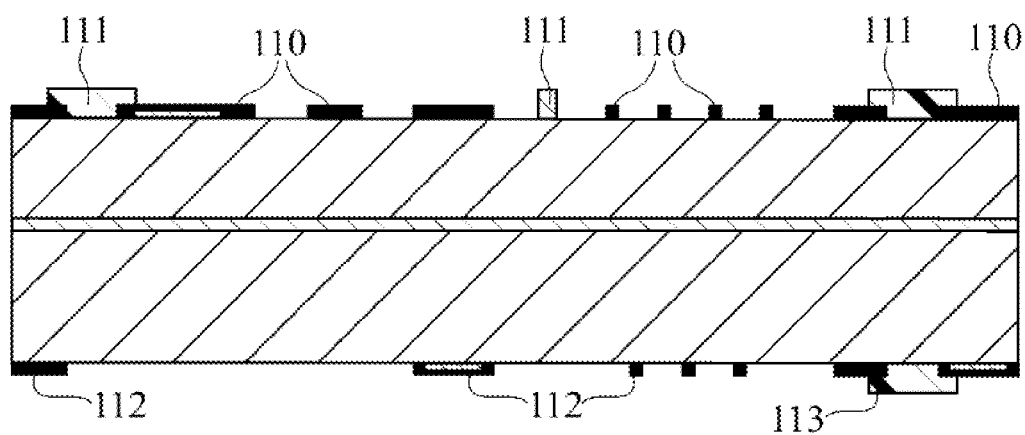

As illustrated in FIG. 9C, next, an oxide film pattern 110 and a resist pattern 111 are formed on the silicon layer 101. An oxide film pattern 112 and a resist pattern 113 are formed on the silicon layer 102. The oxide film pattern 110 has a pattern shape corresponding to the oscillation section M, the frames F1, F2, F3, F4, and F5, and the comb electrode E1. The resist pattern 111 has a pattern shape corresponding to the torsion bars T1, T2, and T3. The oxide film pattern 112 has a pattern shape corresponding to the frames F1, F3, F4, and F5 and the comb electrode E2. The resist pattern 113 has a pattern shape corresponding to the torsion bar T3.

In the formation of the oxide film pattern 110, first, an oxide film such as of silicon dioxide is deposited on the surface of the silicon layer 101 by a CVD method, for example. The thickness of the oxide film is 1 μm, for example. Next, the oxide film is patterned by etching using a resist pattern as a mask. The oxide film pattern 112 is also formed by a method equivalent to that of the oxide film pattern 110. On the other hand, in the formation of the resist pattern 111, first, a liquid photoresist is deposited on the silicon layer 101 by spin coating. Next, through an exposure process and a subsequent development process, the photoresist film is patterned. As a photoresist, for example, AZP4210 (manufactured by AZ Electronic Materials) or AZ1500 (manufactured by AZ Electronic Materials) is used. The resist pattern 113 is also formed by a method equivalent to that of the resist pattern 111.

Figure 10A:
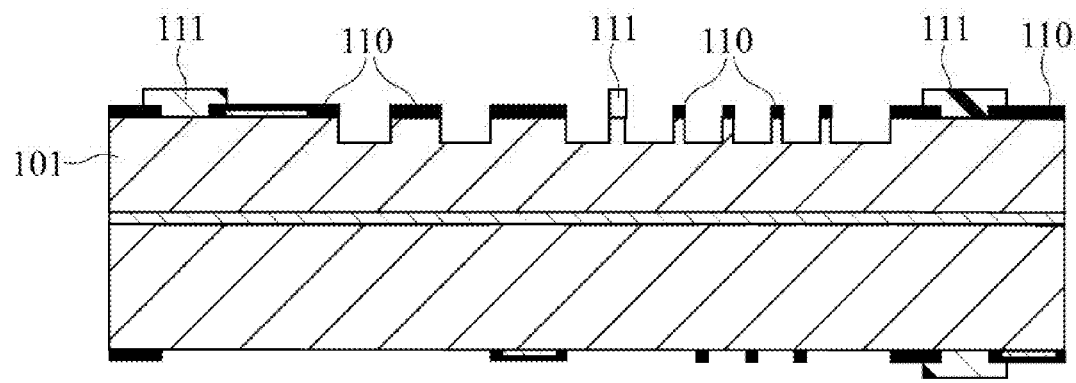
FIGS. 10A to 10C illustrate manufacturing process of the micro movable element subsequent to the manufacturing process illustrated in FIG. 9C.

As illustrated in FIG. 10A, next, anisotropic dry etching is performed on the silicon layer 101 to a predetermined depth by deep reactive ion etching (DRIE) using the oxide film pattern 110 and the resist pattern 111 as masks. The predetermined depth corresponds to the thickness of the torsion bars T1 and T2 and a part of the torsion bar T3 (the first layer section 51), which is 5 μm, for example. In the process, an etching apparatus equipped with a vacuum chamber is used to perform DRIE in the vacuum chamber under predetermined vacuum conditions. In DRIE, the so-called Bosch process in which etching and side-wall protection are alternatively performed may be used. A favorable anisotropic etching process may be performed by using the Bosch process.

Figure 10B:
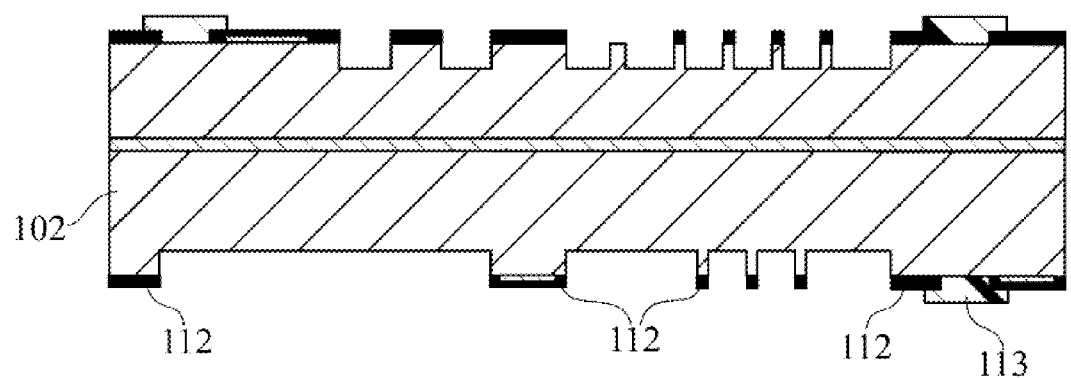

As illustrated in FIG. 10B, next, an anisotropic dry etching process is performed on the silicon layer 102 to a predetermined depth by DRIE using the oxide film pattern 112 and the resist pattern 113 as masks. The predetermined depth corresponds to the thickness of a part of the torsion bar T3 (the first layer section 52), which is 5 μm, for example.

Figure 10C:
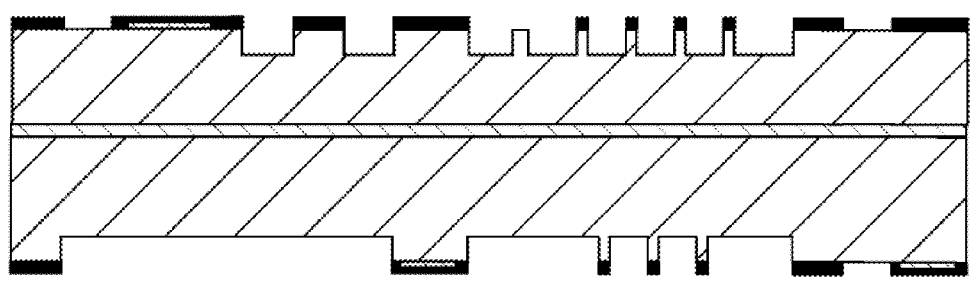

As illustrated in FIG. 10C, next, the resist patterns 111 and 113 are peeled off by supplying a remover. As a remover, for example, AZ remover 700 (manufactured by AZ Electronic Materials) is used.

Figure 11A:
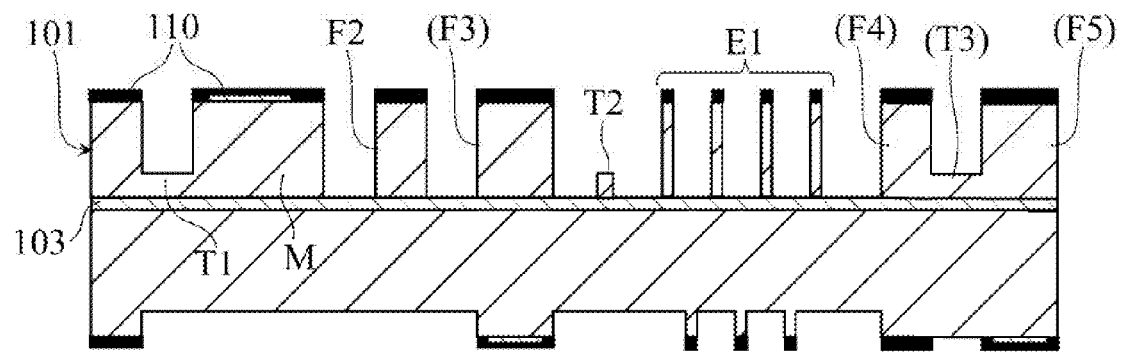
FIGS. 11A to 11C illustrate manufacturing process of the micro movable element subsequent to the manufacturing process illustrated in FIG. 10C.

As illustrated in FIG. 11A, next, anisotropic etching is performed on the silicon layer 101 until it reaches the insulating layer 103 by DRIE using the oxide film pattern 110 as a mask. However, the torsion bars T1 and T2 and the part of the torsion bar T3 (the first layer section 51) which are thin and in contact with the insulating layer 103 are left. In the process, the oscillation section M, parts of the frames F1, F3, F4, and F5, the frame F2, the part of the torsion bar T3, and the comb electrode E1 are formed in addition to the torsion bars T1 and T2.

Figure 11B:
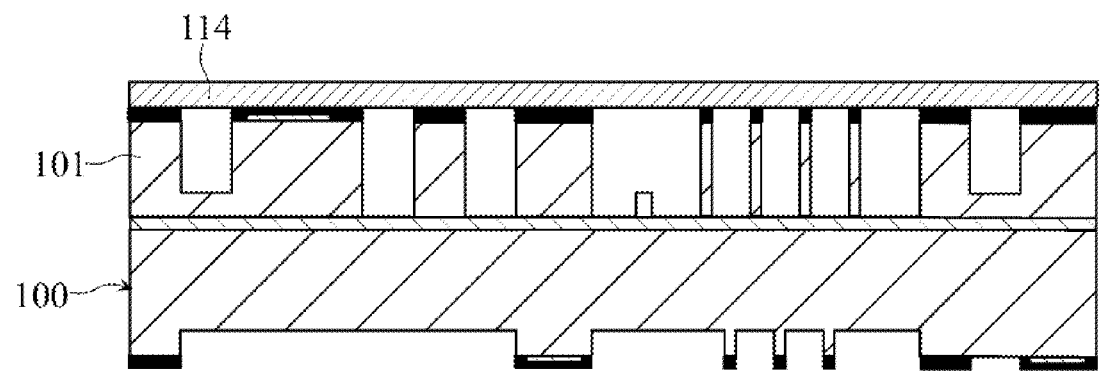

As illustrated in FIG. 11B, next, a film material 114 is bonded to the material substrate 100 on the silicon layer 101 side by using a laminator or a bonding apparatus. As the film material 114, for example, a photosensitive film such as SU-8 3000 Film (manufactured by KAYAKU MICROCHEM) or TMMR (F) S2000 (manufactured by TOKYO OHKA KOGYO) is employed.

Figure 11C:
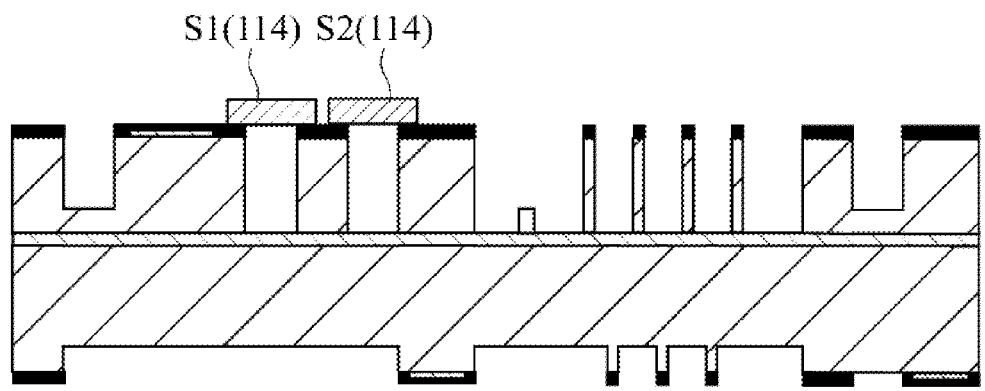

As illustrated in FIG. 11C, next, the film material 114 is patterned to form the support beams S1 and S2. In the case where a photosensitive film is employed as the film material 114, the support beams S1 and S2 are formed by an exposure process and a subsequent development process. In the case where the SU-8 3000 Film is employed as the film material 114, SU-8 Developer (manufactured by KAYAKU MICROCHEM) may be used as a developer in the patterning. In the case where the TMMR (F) S2000 is employed as the film material 114, PM Thinner (manufactured by TOKYO OHKA KOGYO) may be used. On the other hand, in the case where a non-photosensitive material is employed as the film material 114, a predetermined resist pattern is formed on the film material 114 in the process. Next, the film material 114 is patterned by wet etching or dry etching using the resist pattern as a mask.

As illustrated in FIGS. 12A and 12B, next, a sub-carrier 116 is bonded to the material substrate 100 on the silicon layer 101 side via a bonding material 115. As the sub-carrier 116, for example, a silicon substrate, a quartz substrate or a metal substrate is used. As the bonding material 115, for example, a resist, a thermoconductive grease, a sealant or a tape is used. Specific examples of the bonding material 115 include WAFERBOND (manufactured by Brewer Science, Inc.). In the process, the material substrate 100 and the sub-carrier 116 are bonded to each other under heat and pressure.

The purpose for bonding the sub-carrier 116 as described above is to prevent or avert damage to the material substrate 100 or an etching apparatus in the next process. In the next process in which etching is applied to the silicon layer 102 in a vacuum chamber of an etching apparatus, because not only the silicon layer 101 which has been already subjected to etching but also the silicon layer 102 is subjected to etching, the mechanical strength of the material substrate 100 is greatly reduced. The sub-carrier 116 prevents or averts damage of the material substrate 100 as a reinforcing material for the material substrate 100. Assuming that the material substrate 100 is damaged in a vacuum chamber, an etching apparatus is sometimes damaged by a broken piece of the material substrate 100. Also in this case, the sub-carrier 116 which prevents or averts the damage of the material substrate 100 contributes to prevent or avert the damage of the apparatus.

As illustrated in FIG. 13A, next, an anisotropic etching process is performed on the silicon layer 102 until it reaches the insulating layer 103 by DRIE using the oxide film pattern 112 as a mask. However, the part of the torsion bar T3 (the second layer section 52) which is thin and in contact with the insulating layer 103 is left. In the process, parts of the frames F1, F3, F4, and F5 and the comb electrode E2 are formed in addition to the part of the torsion bar T3.

As illustrated in FIG. 13B, next, the sub-carrier 116 is removed from the material substrate 100. In the case where the WAFERBOND (manufactured by Brewer Science, Inc.) is used as the bonding material 115, the material substrate 100 and the sub-carrier 116 may be separated from each other by supplying WAFERBOND Remover (manufactured by Brewer Science, Inc.) to the bonding material 115, for example.

As illustrated in FIG. 13C, next, parts exposed on the oxide film patterns 110 and 112 and parts exposed on the insulating layer 103 are removed by etching. As an etching method, dry etching or wet etching is employed. In the case of employing dry etching, for example, $CF_4$ or $CHF_3$ is employed as an etching gas. In the case of employing wet etching, for example, buffered hydrofluoric acid (BHF) which includes hydrofluoric acid and ammonium fluoride may be used as an etching solution. Thereafter, the wafer to which the series of processes are applied is cut into individual micro movable elements X.

Through the series of processes, the oscillation section M, the frames F1, F2, F3, F4, and F5, the torsion bars T1, T2, and T3, the set of comb electrodes E1 and E2, and the support beams S1 and S2 are formed. Thus, the micro movable element X with support beams is manufactured.

Figure 14A:
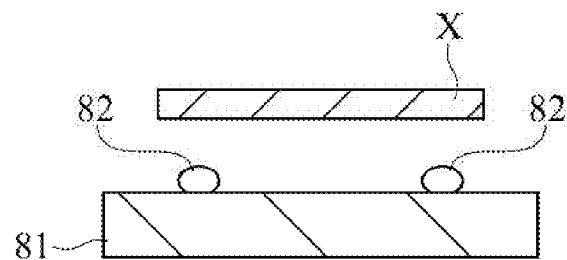
FIGS. 14A to 14D illustrate an assembly process according to an example of an embodiment.
Figure 14B:
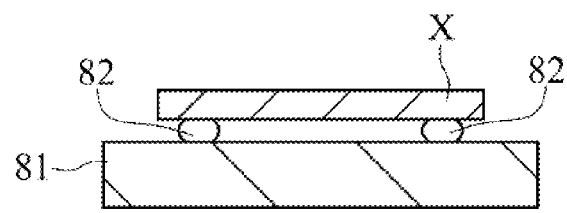

FIGS. 14A to 14D illustrate assembly process for packaging the micro movable element X. In the assembly process, as illustrated in FIGS. 14A and 14B, first, the micro movable element X is mounted on a wiring board 81. A plurality of bumps 82 for electrically connecting the micro movable element X with the wiring board 81 are previously formed on the wiring board 81. The micro movable element X is mounted on the wiring board 81 via the bumps 82. The bumps 82 are made of Au, for example. The micro movable elements X may be arranged in an array and mounted on the wiring board 81.

Figure 14C:
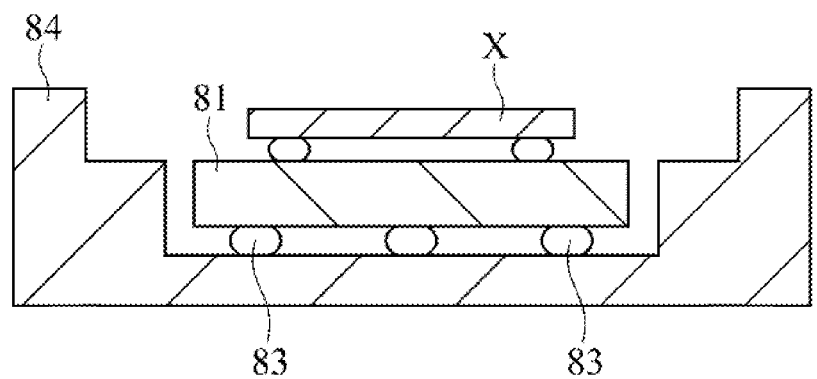
Figure 14D:
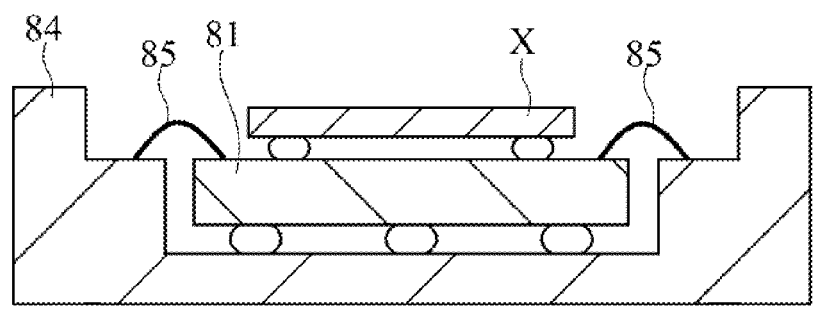

As illustrated in FIG. 14C, next, the wiring board 81 on which the micro movable element X is mounted is mounted on a ceramic package 84 via Ag materials 83, for example. Specifically, after Ag paste is applied to the ceramic package 84 at predetermined places, the wiring board 81 is attached to the ceramic package 84 via the Ag paste. Subsequently, the Ag paste is heated to fix the wiring board 81 to the ceramic package 84. Thereafter, as illustrated in FIG. 14D, the wiring board 81 and the ceramic package 84 are electrically connected to each other by Au wires 85, for example.

Next, the support beams 71 and 72 are cut or removed.

FIG. 15 illustrates a state where the support beams 71 and 72 are cut by irradiation of a laser Lz. As the laser Lz for cutting the support beams 71 and 72, for example, an Nd:YAG laser may be employed. In the case where the support beams 71 and 72 are resist materials, the support beams 71 and 72 may be removed by reactive ion etching or oxygen plasma ashing instead of laser irradiation. Alternatively, oxide films 110a (parts of the oxide film pattern 110) interposed between the support beams 71 and 72 and the surface of the element may be removed by dry etching, and the support beams 71 and 72 may be removed by lift-off. In the method, in the case where the oxide films 110a are silicon dioxide, anhydrous hydrofluoric acid may be used as an etching gas, for example.

In the case where the torsion bars 40 and 50 are not damaged even in the absence of the support beams 71 and 72, the support beams 71 and 72 may be cut or removed by the above method before the assembly process.

In the micro movable element X in which the support beams 71 and 72 are cut or removed, the so-called two-axis drive is possible for the oscillation section 10 or the mirror surface 11.

A reference potential is given to the comb electrodes 61, 62, 65, and 66 at the time of driving the micro movable element X. A reference potential may be given to the comb electrodes 61 and 62 via the electrode pad 35e in the frame 30, the section 32e of the second layer section 32, the conductive via 34, the first layer section 31, the first layer section 51 of the torsion bar 50, the first layer section 21 of the frame 20, the torsion bar 40, and the oscillation section 10. A reference potential may be given to the comb electrodes 65 and 66 via the electrode pad 35e in the frame 30, the section 32e of the second layer section 32, the conductive via 34, the first layer section 31 of the frame 30, the first layer section 51 of the torsion bar 50, and the first layer section 21 of the frame 20. For example, the reference potential is a ground potential, which is preferably maintained at a substantially constant level.

A driving potential is given to the comb electrode 63 to generate an electrostatic force between the comb electrodes 61 and 63. The comb electrode 61 is pulled into the comb electrode 63 by using the electrostatic force, whereby the oscillation section 10 may be rotationally displaced about the axial center A1. A driving potential may be given to the comb electrode 64 to generate an electrostatic force between the comb electrodes 62 and 64. The comb electrode 62 is pulled into the comb electrode 64 by using the electrostatic force, whereby the oscillation section 10 may be rotationally displaced about the axial center A1. A driving potential may be given to the comb electrode 63 via the electrode pad 35a in the frame 30, the section 32a of the second layer section 32, the second layer section 52 of one of the torsion bars 50, and the section 22a of the second layer section 22 of the frame 20. A driving potential may be given to the comb electrode 64 via the electrode pad 35b in the frame 30, the section 32b of the second layer section 32, the second layer section 52 of the other torsion bar 50, and the section 22b of the second layer section 22 of the frame 20. The amount of rotational displacement about the axial center A1 may be controlled by controlling a driving potential given to the comb electrode 63 or the comb electrode 64.

A driving potential is given to the comb electrode 67 to generate an electrostatic force between the comb electrodes 65 and 67. The comb electrode 65 is pulled into the comb electrode 67 by using the electrostatic force, whereby the frame 20 and the oscillation section 10 may be rotationally displaced about the axial center A2. A driving potential may be given to the comb electrode 68 to generate an electrostatic force between the comb electrodes 66 and 68. The comb electrode 66 is pulled into the comb electrode 68 by using the electrostatic force, whereby the frame 20 and the oscillation section 10 may be rotationally displaced about the axial center A2. A driving potential may be given to the comb electrode 67 via the electrode pad 35c in the frame 30 and the section 32c of the second layer section 32. A driving potential may be given to the comb electrode 68 via the electrode pad 35d in the frame 30 and the section 32d of the second layer section 32. The amount of rotational displacement about the axial center A2 may be controlled by controlling a driving potential given to the comb electrode 67 or the comb electrode 68.

Due to the two-axis drive of the oscillation section 10 described above, the reflecting direction of light reflected on the mirror surface 11 disposed on the oscillation section 10 may be switched.

In the method described with reference to FIGS. 9A to 13C, the support beam 71 and the support beam 72 are formed in the film material 114 bonded to the surface of the material substrate 100 into which each part of the micro movable element X is incorporated. That is, the support beams 71 and 72 are formed on the surface of the micro movable element X. The cutting conditions or removal conditions for the support beams 71 and 72 may be optimized, and the support beams 71 and 72 are easily cut or removed. As described with reference to FIG. 15, for example, in the case where the support beams 71 and 72 are cut by irradiation of the laser Lz, the support beams 71 and 72 which are exposed on the surface of the micro movable element X are easily cut without damaging the element structure in the vicinity of the support beams 71 and 72. For example, in the case where the support beams 71 and 72 are removed by the reactive ion etching, oxygen plasma ashing or dry etching, the support beams 71 and 72 are easily removed properly without leaving residues of the support beams 71 and 72 on the surface of the micro movable element X.

In the method described with reference to FIGS. 9A to 13C, a material different from the constituent material of the material substrate 100 may be employed as the film material 114. Accordingly, although the material substrate 100 includes parts excellent in conductivity (the silicon layers 101 and 102) therein, a material which is poor in conductivity may be used as the film material 114. In the method, the support beams 71 and 72 are formed in the film material 114. Therefore, even when a piece of material produced by cutting or removing the support beams 71 and 72 is attached to the surface of the element, it is possible to prevent or avert short circuiting which may occur by the piece of material. Accordingly, the method is suitable for preventing an operation failure caused by short circuit via a piece of material derived from the support beams 71 and 72.

The support beams 71 and 72 are preferably made of an insulating material as described above. Therefore, the method is suitable for preventing or averting short circuiting via a piece of material derived from the support beams 71 and 72.

The micro movable element X may be applied to a sensing device such as an angular velocity sensor or an acceleration sensor. In the micro movable element X applied to a sensing device, the mirror surface 11 may not be disposed on the oscillation section 10.

At the time of driving the micro movable element X applied to an angular velocity sensor, for example, the movable section (the oscillation section 10, the frame 20, the torsion bars 40, and the comb electrodes 61 to 66) is oscillated and operated about the axial center A2 at a predetermined frequency or cycle. This oscillating operation is achieved by alternatively applying a voltage between the comb electrodes 65 and 67 and between the comb electrodes 66 and 68 at a predetermined cycle. For example, in the state where the movable section is oscillated and operated or vibrated as described above, when an angular velocity about the normal line (extending in a direction perpendicular to the paper surface in the plan view of FIG. 1) of the oscillation section 10 acts on the oscillation section 10, the oscillation section 10 is oscillated and operated about the axial center A1 at an amplitude proportional to the angular velocity. Thus, the relative arrangement of the comb electrodes 61 and 63 is periodically changed to periodically change the capacitance between the comb electrodes 61 and 63. Further, the relative arrangement of the comb electrodes 62 and 64 is periodically changed to periodically change the capacitance between the comb electrodes 62 and 64. Based on the change in capacitance, the amount of oscillating displacement of the oscillation section 10 may be detected. Based on the detecting result, an angular velocity acting on the micro movable element X or the oscillation section 10 may be derived.

At the time of driving the micro movable element X applied to an acceleration sensor, the frame 20 and the oscillation section 10 are put into a substantially stopped state with respect to the frame 30. In this state, when an acceleration which is parallel to the paper surface and in the horizontal direction in the plan view of FIG. 1 acts on the oscillation section 10, an inertial force having a vector component parallel to the acceleration is exerted. Thus, a rotating torque about the axial center A1 acts on the oscillation section 10 to generate a rotational displacement (rotational displacement about the axial center A1) proportional to the acceleration at the oscillation section 10. The inertial force may be generated by designing the barycentric position of the oscillation section 10 so as not to overlap the axial center A1 in a direction perpendicular to the paper surface in the plan view of FIG. 1. The amount of rotational displacement may be electrically detected as the change in capacitance between the comb electrodes 61 and 63 and between the comb electrodes 62 and 64. Based on the detecting result, the acceleration acting on the micro movable element X or the oscillation section 10 may be derived. Further, by designing the barycentric position of the frame 20 and the oscillation section 10 so as not to overlap the axial center A2 in a direction perpendicular to the paper surface in the plan view of FIG. 1, an acceleration which is parallel to the paper surface and in a vertical direction in the plan view of FIG. 1 may be electrically detected and derived as the change in capacitance between the comb electrodes 65 and 67 and between the comb electrodes 66 and 68.

The micro movable element X in which the support beams 71 and 72 are cut or removed may be employed as a micromirror element used in an optical switching device.

FIG. 16 is a schematic view of an optical switching device 500 of spatially optical coupled type according to another example of an embodiment. The optical switching device 500 includes a pair of micromirror array units 501 and 502, an input fiber array 503, an output fiber array 504, and a plurality of microlenses 505 and 506. The input fiber array 503 includes a plurality of input fibers 503a. In the micromirror array unit 501, a plurality of micromirror elements 501a corresponding to the respective input fibers 503a are arranged. The output fiber array 504 includes a plurality of output fibers 504a. In the micromirror array unit 502, a plurality of micromirror elements 502a corresponding to the respective output fibers 504a are arranged. Each of the micromirror elements 501a and 502a has a mirror surface for reflecting light. Each of the micromirror elements 501a and 502a is configured to be able to control the direction of the mirror surface. Each of the plurality of microlenses 505 faces the end of the input fiber 503a. Each of the plurality of microlenses 506 faces the end of the output fiber 504a.

Lights L1 emitted from the input fibers 503a are converted into mutually parallel lights by passing through the corresponding microlenses 505 and proceed to the micromirror array unit 501. The light L1 is reflected by the corresponding micromirror element 501a and deflected to the micromirror array unit 502. At this time, the mirror surface of the micromirror element 501a is previously directed to a predetermined direction so that the light L1 enters a desired micromirror element 502a. Next, the light L1 is reflected by the micromirror element 502a and deflected to the output fiber array 504. At this time, the mirror surface of the micromirror element 502a is previously directed to a predetermined direction so that the light L1 enters a desired output fiber 504a via the microlens 506.

As described above, according to the optical switching device 500, the light L1 emitted from each of the input fibers 503a is deflected by the micromirror array units 501 and 502 and thereby reaches the desired output fiber 504a. That is, the input fibers 503a and the output fibers 504a are optically connected in one-to-one correspondence. Deflection angles at the micromirror elements 501a and 502a are changed to thereby switch the output fiber 504a which the light L1 reaches.

Characteristics required for an optical switching device for switching a transmission path of an optical signal transmitted by using an optical fiber as a medium from one fiber to another include large capacity, high speed, and high reliability in switching operation. Based on these standpoints, a micromirror element manufactured by micromachining technology is preferable as a switching element to be incorporated into an optical switching device. According to the micromirror element, a switching process may be performed with an optical signal as it is without converting it into an electrical signal between an optical transmission path on the input side and an optical transmission path on the output side in an optical switching device, which is suitable for obtaining the characteristics.

Figure 17:
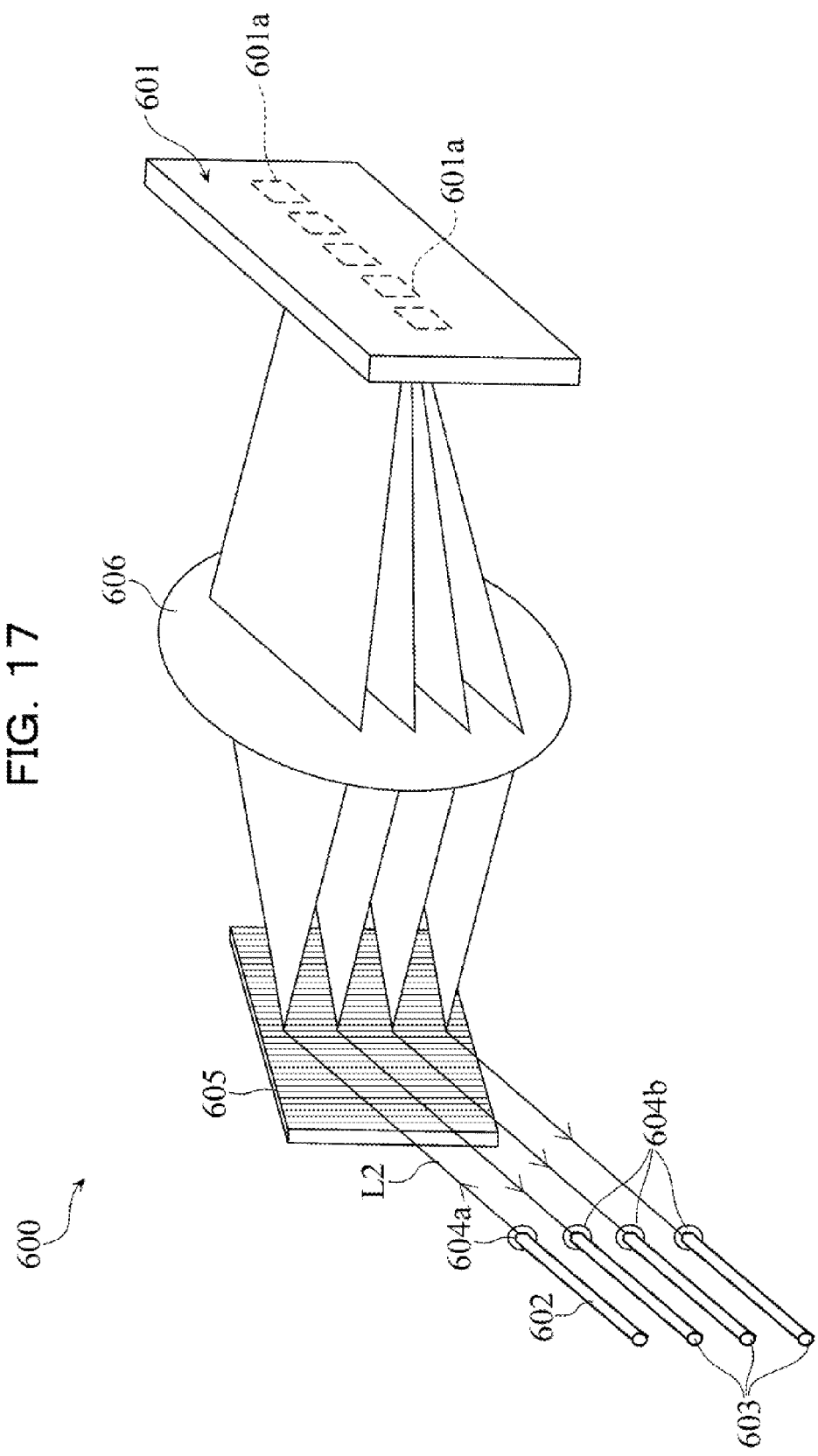
FIG. 17 is a schematic view of an optical switching device in still another example of an embodiment.

FIG. 17 is a schematic view of a wavelength selective optical switching device 600 according to still another example of an embodiment. The optical switching device 600 includes a micromirror array unit 601, one input fiber 602, three output fibers 603, a plurality of microlenses 604a and 604b, a spectroscope 605, and a condenser lens 606. The micromirror array unit 601 has a plurality of micromirror elements 601a. The plurality of micromirror elements 601a are arranged, for example, in line in the micromirror array unit 601. Each of the micromirror elements 601a has a mirror surface for reflecting light. Each of the micromirror elements 601a is configured to be able to control the direction of the mirror surface. The microlens 604a faces the end of the input fiber 602. Each of the microlenses 604b faces the end of the output fiber 603. The spectroscope 605 is a reflective diffraction grating in which the degree of diffraction of reflected light varies depending on a wavelength.

A light L2 emitted from the input fiber 602 is converted into a parallel light by passing through the microlens 604a. The light L2 is reflected by the spectroscope 605. At this time, the light L2 is reflected at various angles depending on a plurality of wavelengths contained in the light L2. The reflected lights pass through the condenser lens 606. In this case, the lights are focused to the respectively corresponding micromirror element 601a in the micromirror array unit 601 depending on the wavelength. The light of each wavelength is reflected by the corresponding micromirror element 601a in a predetermined direction. At this time, the mirror surface of the micromirror element 601a is previously directed to a predetermined direction so that a light having the corresponding wavelength reaches a desired output fiber 603. The light reflected by the micromirror element 601a enters the selected, predetermined output fiber 603 via the condenser lens 606, the spectroscope 605, and the microlens 604b. According to the optical switching device 600, a light having a desired wavelength may be selected from the light L2 as described above.

What is claimed is:

1. A method for manufacturing a micro movable element, comprising:
    forming a movable section, a frame, and a connecting section connecting the movable section with the frame on a substrate;
    bonding a film to a surface of the substrate in during forming the movable section, the frame, and the connecting section;
    patterning the film to form a support structure bridging the movable section and the frame;
    attaching the substrate to a base after patterning the film;
    removing the base after forming the movable section, the frame, and the connecting section; and
    removing at least a part of the support structure after removing the base.

2. The method for manufacturing the micro movable element according to claim 1, wherein
    the support structure is made of an insulating material.

* * * * *